US006366471B1

(12) United States Patent
Edwards et al.

(10) Patent No.: US 6,366,471 B1

(45) Date of Patent: Apr. 2, 2002

(54) HOLDER FOR CLOSELY-POSITIONED MULTIPLE GBIC CONNECTORS

(75) Inventors: William F. Edwards, Livermore; Earl Devenport, San Jose, both of CA (US); Robert Gregory Twiss, Chapel Hill, NC (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 09/607,973

(22) Filed: Jun. 30, 2000

(51) Int. Cl.[7] .................................................. H05K 7/14

(52) U.S. Cl. ....................... 361/796; 361/753; 361/807; 439/79; 385/92

(58) Field of Search ................................ 361/728–730, 361/752, 753, 796, 797, 803, 807–810; 439/59, 79; 385/88, 89, 92, 94

(56) References Cited

U.S. PATENT DOCUMENTS

| | | | | |
|---|---|---|---|---|
| 3,533,045 | A | 10/1970 | Henschen | |
| 3,652,899 | A | 3/1972 | Henschen | |
| 3,704,394 | A | 11/1972 | Johnson | |
| 3,905,665 | A | 9/1975 | Lynch et al. | |
| 4,832,619 | A | 5/1989 | Eck et al. | 439/377 |
| 4,869,680 | A | 9/1989 | Yamamoto et al. | 439/327 |
| 5,016,142 | A | 5/1991 | White | 361/415 |
| 5,123,859 | A | 6/1992 | Davis et al. | 439/405 |
| 5,181,858 | A | 1/1993 | Matz et al. | 439/188 |
| 5,222,168 | A | 6/1993 | Saito et al. | 385/59 |
| 5,291,368 | A | 3/1994 | Conroy-Wass | 361/796 |
| 5,491,418 | A | 2/1996 | Alfaro et al. | 324/402 |
| D372,708 | S | 8/1996 | Hetherington | D14/114 |
| D382,857 | S | 8/1997 | Chen et al. | D13/147 |
| 5,660,567 | A | 8/1997 | Nierlich et al. | 439/620 |
| D386,473 | S | 11/1997 | England et al. | D13/147 |
| 5,716,221 | A | 2/1998 | Kantner | 439/64 |
| 5,757,618 | A | 5/1998 | Lee | 361/686 |
| 5,757,998 | A | 5/1998 | Thatcher et al. | 385/75 |
| 5,767,999 | A | 6/1998 | Kayner | 359/163 |
| 5,801,928 | A | 9/1998 | Burstedt et al. | 361/801 |
| 5,809,328 | A | 9/1998 | Nogales et al. | 395/825 |
| 5,836,785 | A | 11/1998 | Lee | 439/505 |
| 5,879,173 | A | 3/1999 | Poplawski et al. | 438/138 |
| 5,882,211 | A | 3/1999 | Choy et al. | 439/74 |
| 5,901,263 | A | 5/1999 | Gaio et al. | 385/92 |
| D411,827 | S | 7/1999 | Gilliland et al. | D13/147 |
| 5,993,224 | A | 11/1999 | Quillet et al. | 439/79 |
| 6,047,172 | A | 4/2000 | Babineau et al. | 455/300 |
| 6,074,228 | A | 6/2000 | Berg et al. | 439/180 |
| 6,108,198 | A | 8/2000 | Lin | 361/683 |
| 6,115,263 | A | 9/2000 | Babineau et al. | 361/796 |
| D436,919 | S | 1/2001 | Wakefield et al. | D13/110 |

*Primary Examiner*—Jayprakash N. Gandhi

(74) *Attorney, Agent, or Firm*—Beyer Weaver & Thomas, LLP

(57) ABSTRACT

A frame or similar structure is used for positioning two stacked GBIC connectors within a 1 RU form factor height of a router or similar network device. In one aspect, the frame can be constructed, assembled and/or mounted in the absence of a need for screws or similar connectors and/or tools. Hooks, latches, engaging teeth and the like can engage sections of a chassis base plate, to position the GBIC connectors preferably within a cutout formed in a motherboard. Use of a flex circuit for connecting the GBIC connectors to a motherboard avoids the requirement for high-precision placement for positioning.

36 Claims, 4 Drawing Sheets

HOLDER FOR CLOSELY-POSITIONED MULTIPLE GBIC CONNECTORS

Cross-reference is made to U.S. patent application Ser. No. 09/330,434, of Edwards, Schindler, and Twiss filed Jun. 11, 1999 For CLOSELY-POSITIONED MULTIPLE GBIC CONNECTORS; U.S. patent application Ser. No. 09/321,066, of MacKay, filed May 27, 1999 for DISTRIBUTED NETWORK REPEATER SYSTEM; U.S. patent application Ser. No. 09/330,478 of MacKay, Parameswaran, Twiss and Covaro filed Jun. 11, 1999 for CABLE DETECT AND EMI REDUCTION APPARATUS AND METHOD; U.S. patent application Ser. No. 09/330,733 of Dejager, Chen, Sinha, MacKay, Parameswaran, and Twiss filed Jun. 11, 1999 for DISTRIBUTED NETWORK REPEATER MODULE AND METHOD; and U.S. patent application Ser. No. 29/106,266 of Huang, Twiss, Nguyen, and Wood filed Jun. 11, 1999 for REPEATER MODULE, all incorporated herein by reference.

The present invention relates to a method and apparatus for holding two or more gigabit interface converter (GBIC) connectors which are relatively closely spaced and in particular to providing multiple GBIC connectors to achieve efficient use of a panel area or other region.

BACKGROUND INFORMATION

Numerous types of connectors for providing coupling to cables, fiber optic lines, or other communication media are used in various electronic devices including network components or devices such as network routers, hubs, switches, bridges, gateways and the like. As needs for communication links and/or connectors having various characteristics arise, different connector configurations give rise to standards defining the shape and size of the connectors or their components. One such type of connector is termed a gigabit interface converter (GBIC). In accordance with published or defacto standards, the GBIC includes a face or opening region generally rectangular in shape, and having a size of approximately 1.2 inches by 0.3 inches (about 3 cm by 0.75 cm). This face region represents the region to which users typically will need or want to have access, such as for making connections. Accordingly, when a GBIC is to be part of an apparatus, such as a network router, the GBIC is positioned in the router such that the GBIC face region is accessible to the user. Typically, this involves positioning in a portion of an accessible surface of the router cabinet, such as preferably, the face plate of the router cabinet.

A number of published and/or de facto standards have emerged to define preferred shapes and sizes for many electronic components such as network routers. For example, particularly when a router is to be compatible with rack-mounting, it is desirable to provide the router cabinet with a face plate having size of about 1¾ inches by about 17½ inches (about 4.5 cm by about 45 cm). Such a size is compatible with the so-called IRU form factor. When the face panel (or other surface) of an electronic device, such as a router, needs to have numerous components, such as numerous connectors, signal lights or other displays, switches and the like, it becomes important to make efficient use of the available surface area of the front panel (or other surface), particularly when it is desired for the front panel to be sized and shaped in accordance with the 1 RU form factor or other published or de facto standard (which limits the surface area available for such components). Accordingly, when a network router or other electronic component is to be provided with two or more GBICs, it would be useful to provide for mounting of the GBICs in a fashion which achieves space efficiency of the face plates with respect to the two or more GBIC connectors.

When GBICs are mounted using GBIC frames for holding the GBICs, there are numerous costs and other advantages to employing GBIC frames which correspond to published or de facto GBIC frame standards. Accordingly, it would be useful to provide for mounting of two or more GBIC frames in a space-efficient manner substantially without requiring modification of a standard GBIC frame configuration.

As GBIC designs have emerged, many GBIC frames have been configured to accommodate a single GBIC and to accommodate mounting on or with respect to a circuitry component such as a printed circuit board (PCB), with a separate mounting device provided for each GBIC. It is believed that, in general, standard GBIC frame designs were developed at time periods when a single GBIC per router was considered adequate, even though more recently, if more than one GBIC connection is desired, the connectors are, typically, placed horizontally, side-by-side (providing relatively low density layouts, e.g. where panel space is not highly constrained). Current systems, however, make it increasingly useful to provide two or more GBICs in a router or other network device. Accordingly, it would be useful to provide a method and apparatus for mounting GBICs preferably using substantially standard GBIC frames, in a manner which is space-efficient.

Achieving closely-spaced mounting of two or more GBICs places constraints on the amount of volume defined between the GBICs (or otherwise in the vicinity of the GBICs). However, in a typical application, certain electronic components such as serializer-deserializer ("SerDes") chips, should preferably be positioned relatively close to the GBICs such as within about four inches (about 10 cm), preferably within about 2 inches (5 cm), more preferably, about 1 inch (about 2.5 cm) or less.

In some designs, short signal paths can be difficult to implement. For example, relatively long signal paths may be necessary when such components are positioned on a PCB which is separate from the PCB to which the GBIC is mounted or otherwise directly coupled. Accordingly, it would be useful to provide a method and apparatus for mounting two or more GBICs in a space-efficient fashion while permitting the coupling of SerDes chips, or other electronic components to the GBICs with signal paths less than about 4 inches (about 10 cm), preferably less than about 2 inches (about 5 cm).

In many previous arrangements, one or more GBIC connectors were mounted directly (such as being soldered to) a mother board or other main circuit board. Such an arrangement, however, is generally infeasible when it is desired to position at least two stacked GBIC connectors within a 1 RU form factor height. However, there are typically substantial advantages to providing for connections which facilitate the fabrication or assembly of a router (or similar component) to reduce the material and/or labor cost involved in fabrication and accordingly reduce the overall cost of the electronic component. For example, techniques which require relatively high-accuracy (small-tolerance) positioning of components and/or which require installation of screws, rivets or similar connectors can undesirably add to the overall cost of the electronic device. Similar considerations make it advantageous to provide a device which is relatively inexpensive to maintain, repair, retrofit and the like. Accordingly, it would be useful to provide a method system and apparatus for close-positioning of GBIC connectors (such as providing at least two stacked GBIC connectors in a 1 RU form factor height) while achieving or facilitating relatively low fabrication or assembly expense, such as by reducing or avoiding the need for small-tolerance positioning and/or reducing the need for use of screws, rivets or similar separate connectors when installing the GBIC connectors in the electronic device.

In many embodiments, it is believed it will be useful or desirable to provide indicator lights or other signals (related to operation of the GBICs) on (or visible from) the front panel of the electronic device. In at least some configurations, the circuitry and/or LEDs for generating light signals are located on one or more circuit boards coupled to the GBICs and, in general, circuit boards coupled to GBICs are not positioned adjacent the front panel. Although it would at least theoretically be possible to mount indicator lights on a front panel and provide wiring from a circuit board to the front panel, this approach can undesirably add to the cost of manufacturing or fabricating an electronic device. Accordingly, it would be useful to provide a method system and apparatus for showing signal lights or other signals at the front panel of an electronic device for indicating GBIC functions or operations, preferably in the manner which is relatively inexpensive to design and/or fabricate.

SUMMARY OF THE INVENTION

The present invention includes a recognition of the existence, nature and/or origin of problems in previous approaches, including as described herein.

In one aspect, of the present invention, a holder or frame is provided for holding at least two closely spaced GBIC connectors so as to position the GBIC connectors such that their face regions fit within a 1 RU form factor height. In one aspect, the GBIC connectors and frame are not directly attached to the motherboard of the electronic device. In one aspect, a flex circuit, ribbon connector or similar flexible connector couples the GBICs or GBIC connector to a motherboard or other circuit board of the electronic device. By avoiding direct connection or mounting on the motherboard, there is a relatively large tolerance in the positioning of the GBIC connectors, with respect to the motherboard, so that assembly is facilitated and at least some of the cost of manufacturing can be reduced, compared to previous approaches. Preferably, the holder or frame can be coupled to the base or chassis of the electronic device while reducing or eliminating the need for separate screws or other couplings, such as by providing for resilient and/or snap-in positioning and/or holding of the GBIC frame or holder, with respect to the chassis or base. Preferably, the GBIC connectors are spaced in a manner to accommodate GBIC repeaters or other devices, within the GBIC connectors, which may have dimensions exceeding that of the GBIC connector openings, such as stacked GBIC repeaters, e.g., as described and depicted in application Ser. No. 09/330,733 (supra). Preferably such repeaters or similar devices can be accommodated even when positioned in identical (rather than back-to-back) orientations with respect to one another and/or preferably such that the repeaters or similar devices will not extend substantially (preferably, will not extend at all) above the top or bottom of a 1 RU form factor device.

In one aspect, a frame or similar structure is used for positioning two stacked GBIC connectors within a 1 RU form factor height of a router or similar network device. In one aspect, the frame can be constructed, assembled and/or mounted in the absence of a need for screws or similar connectors and/or tools. Hooks, latches, engaging teeth and the like can engage sections of a chassis base plate, to position the GBIC connectors preferably within a cutout formed in a motherboard. Use of a flex circuit for connecting the GBIC connectors to a motherboard avoids the requirement for high-precision placement for positioning.

DETAILED DESCRIPTION OF THE PREFERRED EMBODIMENT

A number of materials and fabrication techniques can be used for forming a holder or frame which holds at least two GBIC connectors in closely-spaced relationship. Preferably, such a frame is relatively inexpensive to produce and/or simple and relatively inexpensive to use, i.e., relatively inexpensive to couple mechanically to an electronic device and/or electrically to a motherboard or other component.

Figure 1:
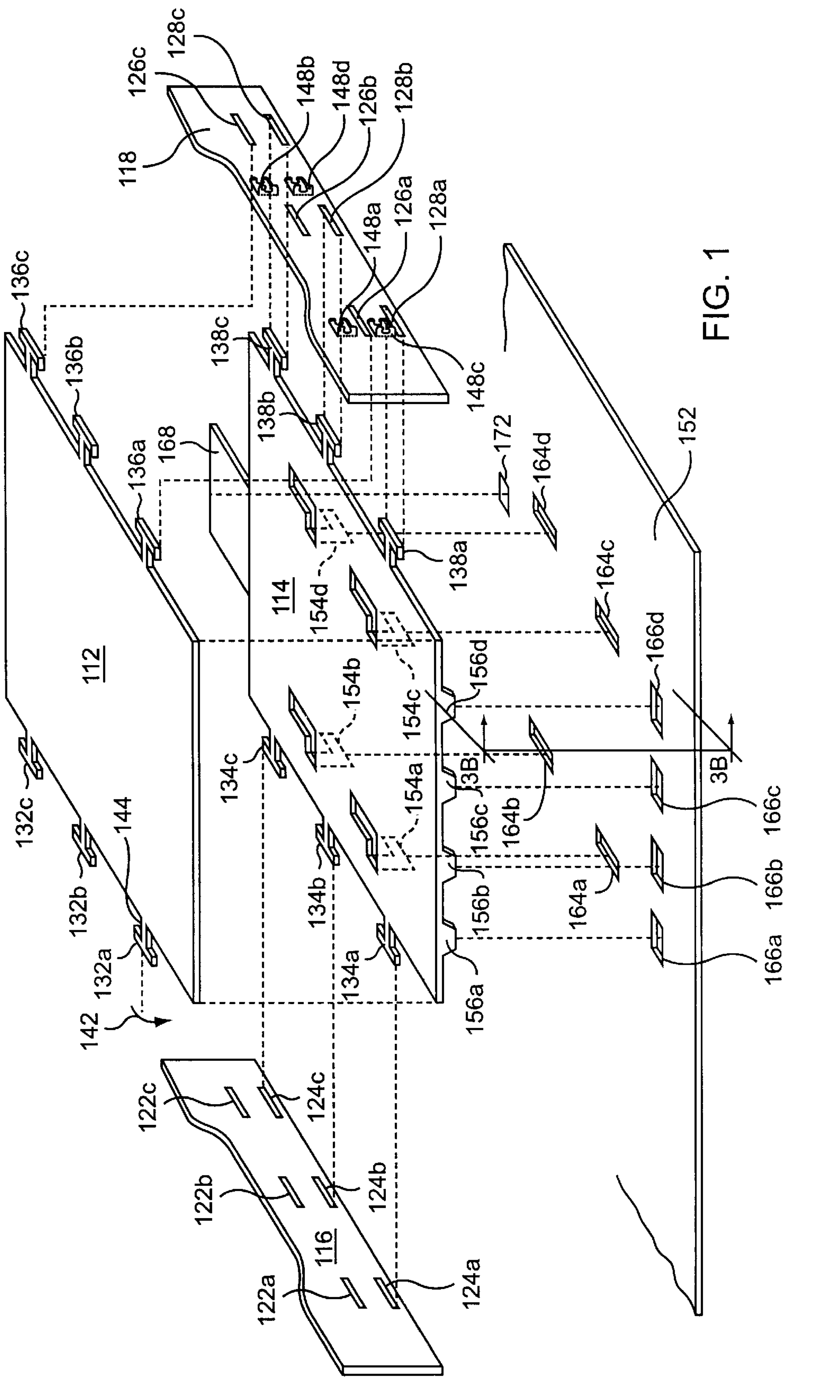
FIG. 1 is a partial, perspective, exploded view of a GBIC connector frame or holder for coupling to a chassis, according to an embodiment of the present invention.
Figure 2:
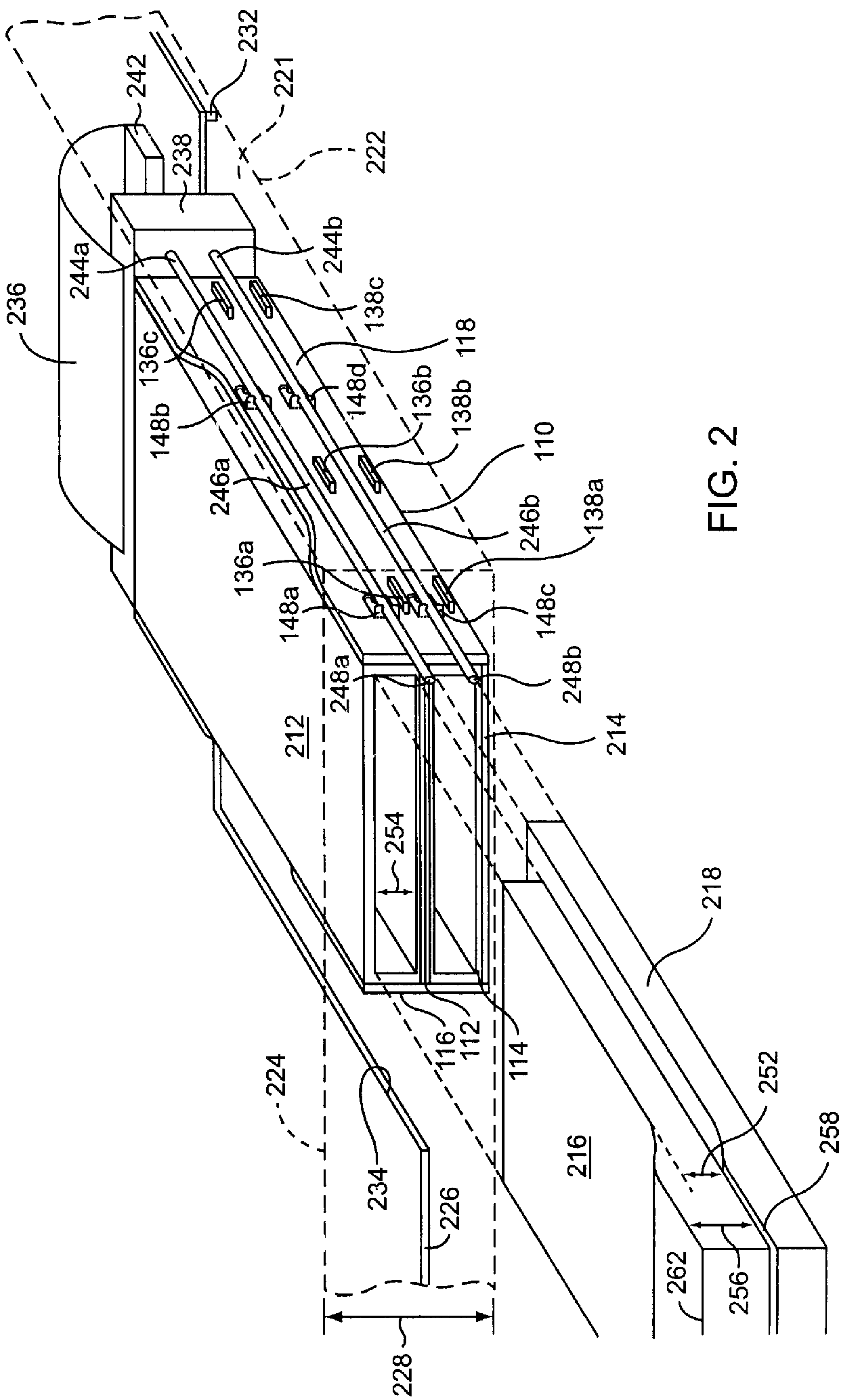
FIG. 2 is a perspective partially exploded view of an assembled frame or holder holding GBIC connectors for receiving GBIC devices, according to an embodiment of the present invention.

In the embodiment depicted in FIG. 1, a GBIC frame or holder can be formed from four plate-like components 112, 114, 116, 118. A number of materials can be used for the frame or components thereof including metals, plastics, resins, fiberglass and the like. In one embodiment, the components 112, 114, 116, 118 are stamped from sheet steel or other sheet metal, preferably at least partially coated with tin or other at least partially conductive material. In the depicted embodiment, a tab and slot system is used for coupling the components to one another. The sidewall pieces 116, 118 are provided with a plurality of slots 122*a,b,c,* 124*a,b,c,* 126*a,b,c,* 128*a,b,c* sized and shaped to receive tabs 132*a,b,c,* 134*a,b,c,* 136*a,b,c,* 138*a,b,c* respectively. After the tabs 132, 134, 136, 138 are inserted through the slots 122, 124, 126, 128, the tabs may be twisted 142 about the stems, e.g., 144, connecting the tabs to the plates to lock the side pieces 116, 118 to the main plates 112, 114, achieving an assembled frame configured, e.g., as depicted in FIG. 2.

In the depicted embodiment, resilient ears 148*abcd* are punched or stamped and folded to project outward from the outer surface of one of the side walls 118, e.g., for positioning and coupling light pipes as described below. It is also possible, and may be preferred, to form resilient snap or latch devices, such as resilient split pins, or the like (not shown) as part of the light pipe itself for coupling to holes or other features formed in the frame. The lower main plate 114 is provided with features for coupling or holding the frame to a chassis or base plate 152. In the depicted embodiment, the features include L-shaped hooks 154*a,b, c,d* which are punched and/or stamped and folded to project downward from the lower surface of the lower plate 114. Portions of the front edge of the plate 114 are stamped and/or folded to form downwardly projecting teeth 156*abcd.*

First and second GBIC connectors 212, 214 (FIG. 2, not shown in FIG. 1) are coupled to the frame such as being soldered or otherwise coupled to the main plates 112, 114 respectively, preferably prior to assembly of the frame. Although embodiments of the present invention can be used for providing many types of connectors, in one embodiment, the connectors 212, 214 are GBIC connectors, e.g., in accordance with published or defacto standards, e.g., as described above, each defining an opening for receiving a gigabit component such as a repeater 216, 218 including a repeater a described, e.g., in U.S. patent application Ser. No. 09/330,733 or the like. As best seen in FIG. 2, preferably the frame is configured to position the GBIC connectors 212, 214 so as to have a desirable shape or position within a chassis or frame 222, (as shown in phantom in FIG. 2) and/or a front panel 224 (shown in phantom in FIG. 2) of an electronic device such as a router hub, switch, gateway, bridge and the like. For example, in one embodiment, even though the longitudinal and lateral axes of the connectors 212, 214 are parallel to the bottom surface of the chassis 222 and/or the motherboard 226 or other circuit board of the electronic component, nevertheless, the connectors 212, 214 are positioned within a front panel height 228 substantially equal to a 1 RU height of about 1¾ inches (about 4.5 cm). In the depicted embodiment, such positioning is facilitated by a configuration which makes it practical to mount the frame or the connectors other than directly on the motherboard 226. For example, in the embodiment depicted in FIG. 2, the frame 110 is coupled directly to the lower surface 221 of the chassis 222 (e.g., as described below) while the motherboard 226 lies in a plane which is raised (e.g., by spacers or the like 232) above the lower surface 221. In this way, the positioning of the connectors 212, 214 is not determined or constrained by the position of the motherboard 226.

In order to provide for a mechanical positioning or coupling of the frame 110 which is not constrained by the position of the motherboard 226, a number of accommodations are provided in various embodiments. In the embodiment of FIG. 2, the motherboard 226 is provided with a cutout region 234 within which the frame 110 substantially fits. In the embodiment of FIG. 2, since there is no direct connection with the motherboard 226, a flex circuit 236 is provided, with the flex circuit 236 preferably having first and second stiffened ends 238, 242 and/or connectors. A first stiffened end 238 couples to connectors on (or accessible with respect to) the repeaters 216, 218 (or connections made with the repeaters and formed on the couplers 212, 214). Preferably, the stiffened region 238 contains multi-pin or multi-receptacle components (as will be understood by those of skill in the art) for achieving a press-on or snap-on assembly, achieving the desired electrical connections. In one embodiment, one or more screws or similar fasteners are used for holding the flex circuit stiffening area 238 to the back of the connectors 212, 214. In one embodiment, the stiffened region 238 also provides an amount of mechanical support to the frame 110. Preferably, the portion of the circuit board 226 which receives the second-end connector 242 is relatively close to the GBIC couplers 212, 214 such as being no more than about 4 inches, preferably no more than about 2 inches, away. By providing a relatively short signal path, the system can more readily accommodate the high frequency signals associated with GBIC communications, while substantially reducing or avoiding unwanted effects such as EMI and/or signal degradation. In general, it will be most common or convenient for light emitting diodes (LEDs) or other signaling devices to be positioned at locations (e.g., 244*a*, 244*b*) of the flex circuit assembly 236 (such as on the stiffened portion 238) which are thus positioned substantially at the rear of the frame (i.e., spaced from the face panel). In the embodiment of FIG. 2, light pipes 246*a,b* are positioned with a first end adjacent the LEDs positions 244*a*, 244*b* and a second end near or adjacent 248*a,b* the front panel 224. Light pipes 246*a,b* can be formed in a number of sizes and shapes and formed of a number of materials, configured to convey at least some light from the LED positions 244*a,b* to the positions adjacent the front panel 248*a,b*. In one example, the light panels may be formed of polycarbonate or thermoplastic materials in general, and may have a diameter of about 1 to 2 millimeters. Preferably, the light pipes can be assembled to the frame substantially without the use of separate fasteners and/or special tools such as providing substantially resilient ears 148*a,b,c,d* configured so that the light pipes 246*a,b* can be manually pressed or snapped into the ears and retained thereby. It is also possible to provide a system in which the light pipes 246*ab* are mechanically snapped into the ears. Also, as noted above in at least some embodiments, resilient pins, posts, snaps, latches or other fasteners (of types that will be understood by those of skill in the art, after understanding the present disclosure) are at least partially formed as part of the light pipe and couple to holes or other features of the frame.

In the depicted embodiment, the repeaters 216, 218 define a first height 252, substantially equal to the opening height 254 of the couplers 212, 214, whereas the front portion of the repeaters 216, 218 define a second, larger height 256. Preferably, the connectors 212, 214 are positioned in such a manner that two repeaters 216, 218 can be positioned therein without substantial interference in the front region 258 between said two stacked repeaters and such that the uppermost front edge 262 will not extend above (or will not substantially extend above) the upper surface of the router (or other electronic component), preferably will not extend above a 1 RU front panel height 228.

Figure 3A:
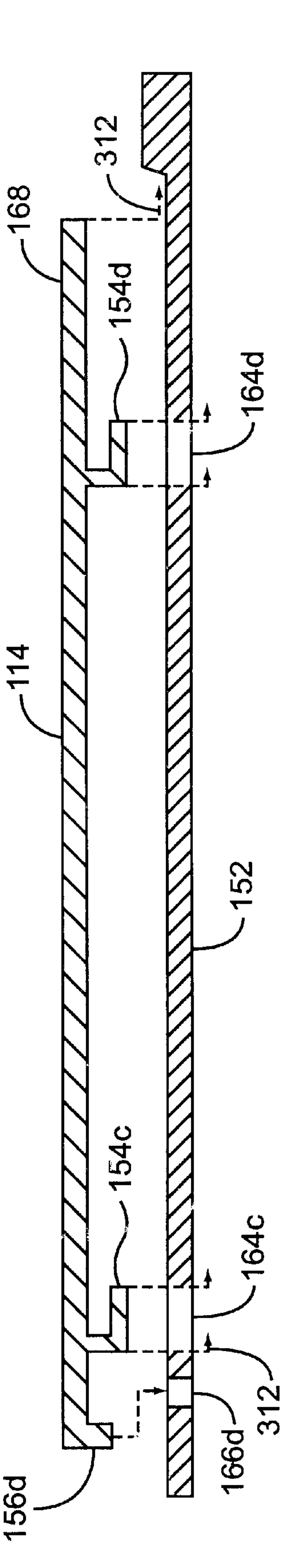
FIG. 3A is a cross-section through a holder bottom plate and portion of a chassis prior to assembly.
Figure 3B:
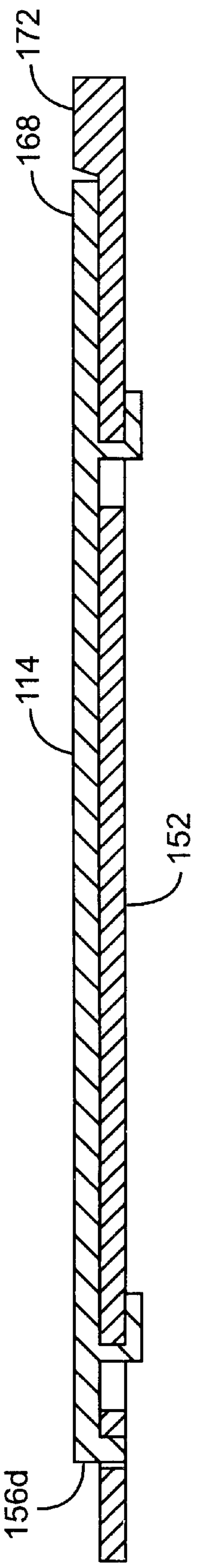
FIG. 3B is a cross-section taken through line 3B—3B of FIG. 1.

In assembly, connectors 212, 214 are soldered or otherwise coupled to the main plates 112, 114 respectively. Tabs 132*a,b,c,* 134*a,b,c,* 136*a,b,c,* 138*a,b,c* are inserted through slots 122*a,b,c,* 124*a,b,c,* 126*a,b,c,* 128*a,b,c* in the side walls 116, 118 and the tabs are twisted (e.g., to positions depicted in FIG. 2) to couple the side walls 116, 118 to the plates 112, 114. The stiffened region 238 of the flex circuit 236 is pressed on to the back connectors of the GBIC couplers 212, 214 and held in place by screws (not shown). The light pipes 236*a,b* are snapped in place, e.g. as depicted in FIG. 2. The assembly is positioned with the L-shaped hooks 154*a,b,c,d* aligned with corresponding slots or openings in the lower surface 152 of the chassis, inserted through the openings 164*a,b,c,d* (see FIG. 3A) and then pushed backwards or rearwardly 312. As the lower plate 114 is pushed backward or rearwardly 312, the L-shaped hooks 154*c,d* engage the rear edges of the openings 164*a,b,c,d* and, as shown in FIG. 3B, when rearward movement is prevented by such engagement, and/or by engagement of a rear tab 168 with a stop member 172, the front teeth 156*a,b,c,d* are, at that time, aligned with corresponding openings 166*a,b,c,d* and received therein as shown in FIG. 3*b*. In this way, the frame is securely positioned and held with respect to the chassis 152 without the need for separate connectors (such as screws, rivets, and the like) and/or tools. Coupling the frame 110 to the chassis bottom 152 can be performed manually or using a mechanism. After the frame 110 is coupled to the chassis bottom 152, the flex circuit coupler 242 can be pushed onto or otherwise coupled to pins or other connectors of the motherboard 226, e.g., as shown in FIG. 2.

In light of the above description, a number advantages of the present invention can be seen. The present invention provides a feasible and economic manner of positioning two stacked GBIC connectors in a generally horizontal orientation to fit within a 1 RU height. The present invention removes the constraints on GBIC connector placement based on the position of a motherboard in an electronic device. The present invention provides an economic and feasible manner for providing signal lights or other signals from a rear portion of a GBIC connector assembly to a front panel region. The present invention makes it possible to reduce or eliminate some or all screws, bolt and similar separate connectors in the assembly and mounting of the GBIC connectors and frames. By providing a flex circuit connection rather than a direct or aligned connection, relatively large tolerances in positioning of the GBIC connectors can be provided, reducing the amount of precision (and costs) associated with positioning or mounting GBIC connectors.

Figure 4A:
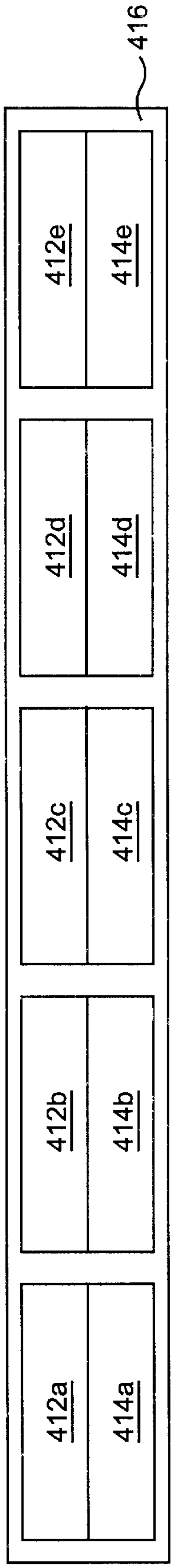
FIGS. 4A, B and C are front, elevational, simplified views of network device front panels according to additional embodiments of the present invention.
Figure 4B:
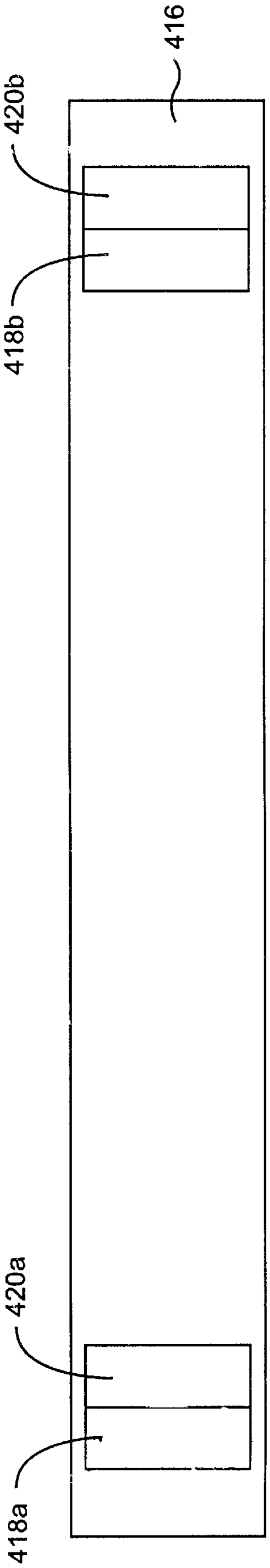
Figure 4C:
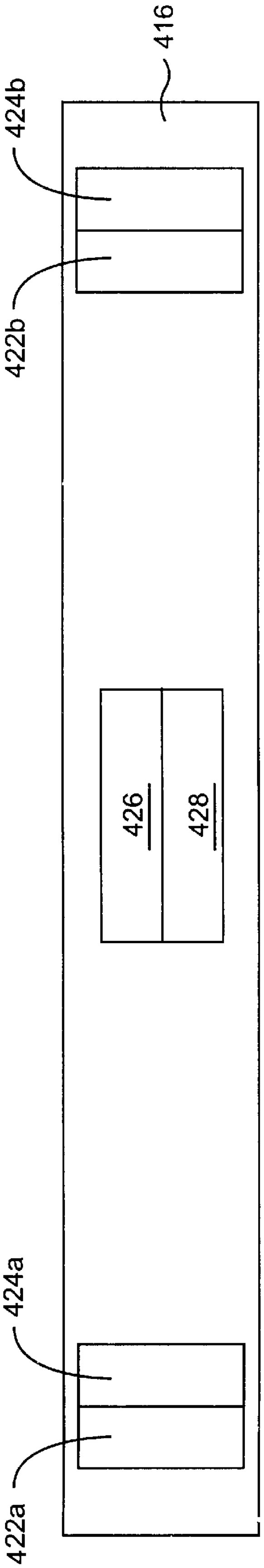

A number of variations and modifications of the invention can be used. It is possible to use some aspects of the invention without using others. For example, it is possible to use some or all features of the present invention without employing a 1 RU form factor or front panel size. It is possible to use some or all features of the present invention to mount or couple a single GBIC connector or three or more stacked GBIC connectors. It is possible to provide two or more units of stacked GBIC connectors in an electronic device. It is possible to use the present invention to position GBIC connectors with openings other than on a front panel such as a rear panel, side panel and the like. Although an embodiment was described in which a GBIC holder or frame was formed from sheet metal components, it is also possible to form a frame using other materials or devices such as by injection molding a frame, or components thereof. In some embodiments, it may be desirable to form one or more light pipes integrally with the injection molding or other formation of a frame or frame component. Although in an embodiment described above, GBIC connectors were coupled to frame members by soldering, it is also possible to use other devices and materials for coupling, such as adhesives, resilient latches, rivets, screws and similar connectors and the like. Although in the preferred embodiment, multiple ones of the frame assembly and positioning can be performed substantially manually, without the need for tools and/or separate connectors, it is also possible to mechanize or automate some or all portions of the assembly, and to use tools or connectors such as screws, bolts, rivets and the like, if desired. If desired, some or all components may be coupled using adhesives, welding, soldering and the like. As generally depicted in FIG. 4A, multiple stacked-horizontal GBIC connectors (such as ten connectors arranged in five stacked pairs 412*a*,414*a*, 412*b*,414*b*,412*c*,414*c*,412*d*,414*d*, 412*e*,414*e*) preferably within a 1 RU form factor front panel area 416. It is possible to orient GBIC connectors in a vertical orientation 418*a*,420*a*,418*b*,420*b*, FIG. 4B, in addition to the horizontal scheme described and depicted above. There is no theoretical reason why a network device can not be provided with both vertically oriented GBIC connectors 422*a*, 424*a*,422*b*,424*b*, as well as horizontally oriented GBIC connectors 426, 428 (FIG. 4C) in the same network device 416.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and/or reducing cost of implementation. The present invention includes items which are novel, and terminology adapted from previous and/or analogous technologies, for convenience in describing novel items or processes, do not necessarily retain all aspects of conventional usage of such terminology.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus for a computer network component, said component having a chassis and a substantially planar main circuit board, defining a first plane, the apparatus comprising:

a face plate, coupled to said chassis, defining a 1 RU face plate height of about 1.75 inches;

first and second GBIC connectors each defining an opening in said face plate, each opening having a first width measured along a first dimension parallel to said first plane and having a height, measured along a second dimension substantially perpendicular to said first dimension, less than said first width, said GBIC connectors being positioned in a stacked relationship to define a stacked height at least equal to said height of said first connector plus said height of said second connector; and wherein said stacked height is less than said 1 RU height.

2. An apparatus, as claimed in claim 1, wherein said computer network component is selected from the group consisting of a router, a hub, a bridge, a gateway and a network switch.

3. An apparatus, as claimed in claim 1, wherein at least one of said GBIC connectors is mounted with respect to said chassis along a mounting plane parallel to but different from said first plane.

4. An apparatus, as claimed in claim 1, wherein said circuit board provides a cutout portion for receiving at least a part of at least one of said first and second GBIC connectors.

5. An apparatus, as claimed in claim 1, further comprising a frame for holding said first and second connectors and for coupling to said chassis.

6. An apparatus, as claimed in claim 5, wherein said frame is configured to couple to said chassis in the absence of separate connector components.

7. An apparatus, as claimed in claim 5, wherein said frame comprises a plurality of interconnected plates.

8. An apparatus, as claimed in claim 7, where in at least one of said plates is coated with a substantially conductive material.

9. An apparatus, as claimed in claim 5, wherein said frame includes at least a first injection-molded component.

10. An apparatus, as claimed in claim 5, wherein said frame includes a clip for retaining at least a first light pipe.

11. An apparatus, as claimed in claim 1, further comprising at least a first flex circuit for coupling, electronically, said at least said first GBIC connector to said main circuit board.

12. An apparatus, as claimed in claim 11, wherein said flex circuit comprises a stiffened region for electronically coupling to said at least first GBIC connector.

13. An apparatus, as claimed in claim 11, wherein said flex circuit contains a stiffened region for mechanically coupling to at least a portion of said frame.

14. An apparatus, as claimed in claim 11, further comprising at least a first signal light positioned on said flex circuit.

15. An apparatus, as claimed in claim 11, further comprising a light pipe having a first end adjacent said signal light and a second end adjacent said front panel.

16. A method for providing a computer network component, said component having a chassis and a substantially planar main circuit board, defining a first plane, the apparatus comprising:

coupling a face plate to said chassis, defining a 1 RU face plate height of about 1.75 inches;

providing first and second GBIC connectors each defining an opening in said face plate, each opening having a first width measured along a first dimension parallel to said first plane and having a height, measured along a second dimension substantially perpendicular to said first dimension, less than said first width, positioning said GBIC connectors in a stacked relationship to define a stacked height at least equal to said height of said first connector plus said height of said second connector; and wherein said stacked height is less than said 1 RU height.

17. A method, as claimed in claim 16, wherein said computer network component is selected from the group consisting of a router, a hub, a bridge, a gateway and a network switch.

18. A method, as claimed in claim 16, further comprising mounting at least one of said GBIC connectors with respect to said chassis along a mounting plane parallel to but different from said first plane.

19. A method, as claimed in claim 16, further coupling a frame for holding said first and second connectors to said chassis.

20. A method, as claimed in claim 19, wherein said step of coupling frame is to said chassis is performed in the absence of using separate connector components.

21. A method as claimed in claim 19, further comprising coupling at least a first light pipe to said frame.

22. A method, as claimed in claim 19, wherein said frame includes a clip and wherein said step of coupling said at least first light pipe comprises using said clip.

23. A method, as claimed in claim 16, further comprising using at least a first flex circuit for coupling, electronically, said at least said first GBIC connector to said main circuit board.

24. A method, as claimed in claim 23, wherein said flex circuit comprises a stiffened region and further comprising mechanically coupling said stiffened region to at least a portion of said frame.

25. Apparatus for a computer network component, said component having a chassis and a substantially planar main circuit board, defining a first plane, the apparatus comprising:

a face plate, coupled to a chassis, defining a 1 RU face plate height of about 1.75 inches;

first and second GBIC connectors each defining an opening in said face plate, each opening having a first width measured along a first dimension parallel to said first plane and having a height, measured along a second dimension substantially perpendicular to said first dimension, less than said first width;

means for positioning said GBIC connectors with respect to said chassis in a stacked relationship to define a stacked height at least equal to said height of said first connector plus said height of said second connector; and wherein said stacked height is less than said 1 RU height.

26. An apparatus, as claimed in claim 25, wherein said means for positioning includes means for mounting at least one of said GBIC connectors with respect to said chassis along a mounting plane parallel to but different from said first plane.

27. An apparatus, as claimed in claim 25, further comprising means, in said circuit board, for accommodating at least a part of at least one of said first and second GBIC connectors.

28. An apparatus, as claimed in claim 25, wherein said means for positioning comprises means for holding said first and second connectors and for coupling to said chassis.

29. An apparatus, as claimed in claim 28, wherein said means for coupling to said chassis comprises hooks for engaging openings in said chassis.

30. An apparatus, as claimed in claim 28, wherein said means for coupling to said chassis comprises teeth configured for being received in openings formed in said chassis.

31. An apparatus, as claimed in claim 28, wherein said means for holding and coupling is configured to couple to said chassis in the absence of separate connector components.

32. An apparatus, as claimed in claim 28, further comprising means for retaining at least a first light pipe.

33. An apparatus, as claimed in claim 32, wherein said means for retaining is formed as part of said means for holding and coupling.

34. An apparatus, as claimed in claim 28, further comprising at least partially flexible means for coupling, electronically, said at least said first GBIC connector to said main circuit board.

35. An apparatus, as claimed in claim 34, further comprising means for mechanically coupling said at least partially flexible means to at least a portion of said means for holding and coupling.

36. An apparatus, as claimed in claim 34, further comprising means for providing at least a first signal light from said at least partially flexible means to said front panel.

* * * * *